United States Patent
Cress (10) Patent No.: US 7,225,420 B2
(45) Date of Patent: May 29, 2007

(54) SYSTEM AND METHOD FOR SIGNAL INTEGRITY TESTING OF ELECTRONIC CIRCUITS

(75) Inventor: David S. Cress, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 142 days.

(21) Appl. No.: 11/054,806

(22) Filed: Feb. 10, 2005

(65) Prior Publication Data

US 2006/0190872 A1 Aug. 24, 2006

(51) Int. Cl.
*G06F 9/45* (2006.01)
*G06F 17/50* (2006.01)

(52) U.S. Cl. .................. 716/6; 716/1; 716/4; 716/5
(58) Field of Classification Search .......... 716/4–6, 716/1, 18; 703/2, 13–19
See application file for complete search history.

(56) References Cited

U.S. PATENT DOCUMENTS

| | | | |
|---|---|---|---|
| 5,838,582 A | | 11/1998 | Mehrotra et al. |
| 6,766,264 B2 * | | 7/2004 | Jung et al. .............. 702/107 |
| 6,772,403 B1 * | | 8/2004 | Sasaki ...................... 716/6 |
| 6,920,402 B1 * | | 7/2005 | Liaw et al. ............... 702/57 |
| 7,081,762 B2 * | | 7/2006 | McNitt et al. ............ 324/628 |
| 2003/0056569 A1 | | 3/2003 | Jansen |
| 2003/0182640 A1 | | 9/2003 | Alani et al. |

OTHER PUBLICATIONS

Attarha et al., Signal Integrity Fault Analysis Using Reduced-Order Modeling, Annual ACM IEEE Design Automation Conference, Proceedings of the 39th Conference on Design Automation in New Orleans, Jun. 10-14, 2002, p. 4, Publisher: DAC.

* cited by examiner

Primary Examiner—Jack Chiang
Assistant Examiner—Nghia M. Doan
(74) Attorney, Agent, or Firm—Fogg & Powers LLC (57) ABSTRACT

A system and method are disclosed for measuring signal crosstalk in an electronic circuit device or Integrated Circuit (IC) device, correlating the results with modeled information, and accurately identifying one or more levels of coupling noise in the device. For example, a system is disclosed that provides data on levels of crosstalk between conductive lines in a device. The system uses programmable victim and aggressor lines, programmable drive capability, and programmable loading through one or more known crosstalk structures to compare an output signal with a reference signal and accurately identify one or more levels of coupling noise in the device.

18 Claims, 5 Drawing Sheets

SYSTEM AND METHOD FOR SIGNAL INTEGRITY TESTING OF ELECTRONIC CIRCUITS

GOVERNMENT LICENSE RIGHTS

The U.S. Government may have certain rights in the present invention as provided for by the terms of Contract No. DTRA01-02-D-0008 awarded by the Defense Threat Reduction Agency.

BACKGROUND OF THE INVENTION

1. Technical Field

The present invention relates generally to the electronic circuit test field, and more particularly, but not exclusively, to a system and method for programmable signal integrity testing to identify levels of coupling noise in an electronic circuit such as, for example, a packaged electronic circuit device or semiconductor Integrated Circuit (IC) device.

2. Description of Related Art

In the design and manufacture of electronic circuit devices or IC devices including, for example, Application Specific IC (ASIC), Large-Scale IC (LSIC), or Very Large-Scale IC (VLSIC) devices, a significant problem encountered with such devices is that the input and output terminals of the logic circuit units (e.g., circuit cells, blocks, etc.) in the devices are interconnected with metallic wiring or other forms of conductive lines. Consequently, the very high integration and mounting densities required of the circuit cells, blocks and wiring in such devices create significant levels of signal crosstalk or coupling noise. Signal crosstalk and coupling noise are derived from signal interference in electronic circuit devices or IC devices, which is caused by the close proximities of the connecting wires or conductors throughout the device. Signal crosstalk and coupling noise have a major effect on the performance, signal integrity and reliability of the circuit devices involved. Also, signal crosstalk and coupling noise problems are exacerbated in high speed and very large-scale circuit devices.

Currently, levels of signal coupling between multiple layers of metal or other conductive materials in a circuit device can be difficult to quantify with any reasonable degree of accuracy. For example, no technique currently exists that can be used to measure signal crosstalk in a circuit device and correlate the results to estimated modeling information in order to identify levels of coupling noise in the device. Thus, it would be advantageous to have a system and method that can measure signal crosstalk in an electronic circuit device or IC device, correlate the results to modeled information, and accurately identify one or more levels of coupling noise in the device involved. As described in detail below, the present invention provides such a system and method.

SUMMARY OF THE INVENTION

The present invention provides a system and method for measuring signal crosstalk in an electronic circuit, electronic circuit device or IC device, correlating the results with reference information, and accurately identifying one or more levels of coupling noise in the device involved. In a preferred embodiment, a system is used to provide data on the level(s) of crosstalk between conductive lines in a device. Also, the system uses multiple programmable victim and aggressor lines, programmable drive capability, and programmable loading through one or more known crosstalk structures to compare an output signal with a reference signal and accurately identify one or more levels of coupling noise in the device.

For example, in an embodiment of the invention, an external reference signal is used to detect upsets or crosstalk in the circuit device involved. The external reference signal can be a steady state DC level or a switching signal. As such, using the programmability features of the present invention, numerous combinations of coupling can be measured at a time. For example, one or more lines in the device can be programmed to represent victim lines, while other lines in the device can be programmed to represent aggressor lines. An output signal of the system is compared to a known signal, or a DC offset voltage, to determine an exact level of upset or crosstalk that exists in the device. Alternatively, an AC clocking signal can be used to measure timing push-out or edge degradation in the device. Thus, the programmability features of the present invention enable testing of different noise coupling circuits in a device, and can provide both positive and negative responses to signal faults, as well as the levels at which the faults occurred. Also, the present invention can measure switching overshoot in the device, the level of the overshoot, and the length of time that the overshoot exceeded a predefined level.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
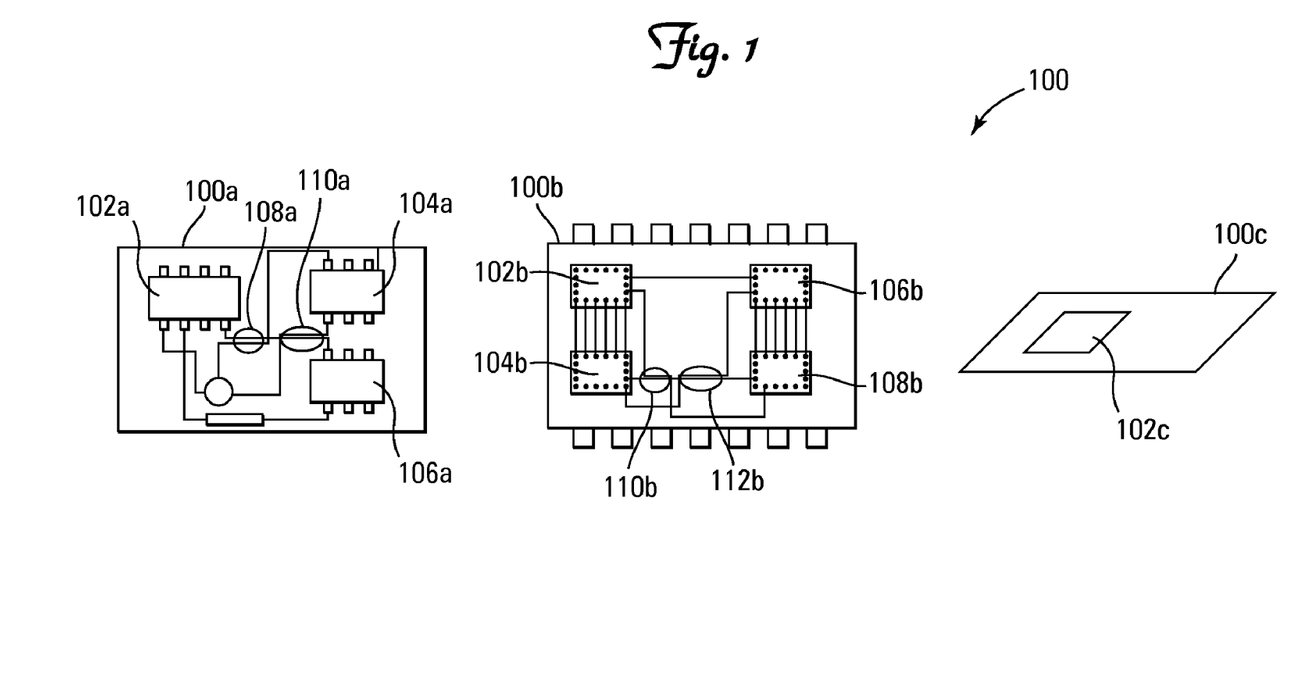
FIG. 1 depicts a pictorial representation of a plurality of example electronic circuit layouts (or environments), each of which may be used to implement one or more embodiments of the present invention.

With reference now to the figures, FIG. 1 depicts a pictorial representation of a plurality of example electronic circuit layouts (or environments) 100a–100c, each of which may be used to implement one or more embodiments of the present invention. For example, electronic circuit layout 100a can represent a circuit board, which includes a plurality of electronic circuit devices 102a, 104a and 106a. Each electronic circuit device 102a, 104a and 106a can be, for example, a packaged semiconductor device (e.g., including one or more chips) providing one or more logical functions. As shown, at least one terminal of each electronic circuit device 102a, 104a and 106a is connected via a conductive wire or line to at least one terminal of another electronic circuit device 102a, 104a and 106a. Notably, at two areas or regions (e.g., indicated by the ellipses 108a, 110a) in electronic circuit layout 100a, two interconnecting conductive wires or lines are arranged in close proximity to each other.

Thus, at these proximal regions 108a, 110a in electronic circuit layout 100a, significant levels of signal crosstalk and coupling noise can occur. Notably, although the example layout 100a shown in FIG. 1 can represent a circuit board, it should be understood that the present invention can include any suitable circuit layout having interconnecting signal transmission lines or wires in proximity to each other, wherein signal crosstalk and/or coupling noise can occur.

As another example of an environment where the present invention may be implemented, electronic circuit layout 100b in FIG. 1 can represent, for example, a packaged electronic device mounted on a semiconductor substrate (e.g., one or more of electronic circuit devices 102a, 104a and 106a in electronic circuit layout 100a). As shown, electronic circuit device layout 100b includes a plurality of component devices (e.g., flip-flops, gates, etc.) 102b, 104b, 106b and 108b, which can perform certain logical functions in electronic circuit device layout 10b. At least one terminal of each component device 102b, 104b, 106b and 108b is connected via a conductive wire or line to at least one terminal of another component device 102b, 104b, 106b and 109b. Notably, at two regions (e.g., indicated by the ellipses 110b, 112b) in electronic circuit layout 100b, two interconnecting conductive wires or lines are arranged in close proximity to each other. Thus, at these proximal regions 110b, 112b in electronic circuit layout 100b, significant levels of signal crosstalk and coupling noise can occur.

Also, in electronic circuit layout 100b, each component device 102b, 104b, 106b and 108b includes other electronic devices (e.g., transistors, resistors, capacitors, inductors) as subcomponents, which are internally interconnected with conductive wires or lines. Therefore, signal crosstalk and coupling noise can also occur in those regions where the subcomponents' internal interconnecting wires or lines are arranged in close proximity to each other.

As yet another example of an environment where the present invention may be implemented, electronic circuit layout 100c in FIG. 1 can represent, for example, an IC 102c. IC 102c can be an ASIC, LSIC, VSLIC or any suitable type of semiconductor IC device in which significant levels of signal crosstalk and coupling noise can occur. For example, the integration densities and mounting densities of the cells, blocks or units arranged in IC 102c are typically maximized to minimize the size of IC 102c. Consequently, the interconnecting wires or lines between the cells, blocks or units in IC 102c are arranged in very close proximity to one another. Furthermore, given the high integration and mounting densities desired, the polysilicon conductors within the cells, blocks or units in IC 102c are also arranged in very close proximity to one another. Therefore, significant levels of signal crosstalk and coupling noise can occur due to the very close proximal arrangement of these conductive wires or lines.

Figure 2:
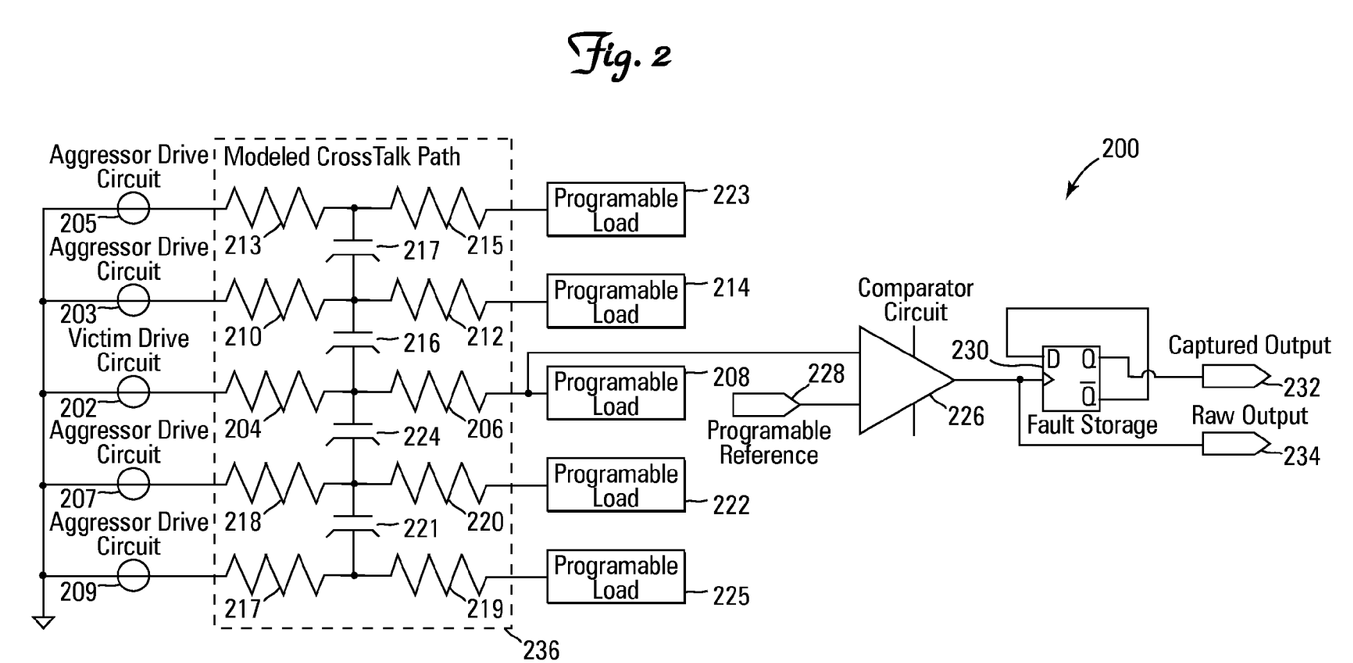
FIG. 2 depicts a schematic block diagram of an example signal integrity test system, which can be used to implement a preferred embodiment of the present invention.

FIG. 2 depicts a schematic block diagram of an example signal integrity test system 200, which can be used to implement a preferred embodiment of the present invention. Notably, signal integrity test system 200 can be located internally or externally with respect to an electronic circuit, electronic circuit device or IC device to be tested. As shown, for this example embodiment, system 200 includes a plurality of variable drive circuits 202, 203, 205, 207 and 209 coupled to selected resistive and capacitive components (described in detail below), which in combination, function to provide a modeled or customized crosstalk circuit or path (indicated generally as 236).

Specifically, for this illustrative example, system 200 includes a variable drive circuit 202 connected to one end of a resistor 204. The second end of resistor 204 is connected to one end of a resistor 206, and the second end of resistor 206 is connected to a programmable load 208 and a first input of a comparator circuit 226. For this example embodiment, comparator circuit 226 can be an analog differential amplifier.

For test purposes in this example, variable drive circuit 202 has been selected to function as a drive circuit for a victim line formed by resistors 204 and 206. Also, for this example, the victim line can be driven by a digital signal (e.g., via variable drive circuit 202), an external analog signal, or a DC voltage level (e.g., through a transmission gate). Thus, for example, the victim line can be driven by a switching signal or a steady state DC level. Programmable load 208 provides a source for current flow through the victim line. Notably, by use of the variable drive circuit 202 and programmable load 208, the victim line (e.g., composed of resistors 204, 206) is essentially passed through a customized crosstalk circuit or path (236) to comparator circuit 226.

A programmable reference circuit 228 is connected to a second input of comparator circuit 226, and an output of comparator circuit 226 is connected to the clock input of a (e.g., fault storage) flip-flop 230 and an output connection (e.g., raw output) 234 of system 200. The programmable reference circuit 228 can provide, for example, crosstalk data based on one or more simulation models representing known victim and aggressor line structures. As such, the output of programmable reference circuit 228 can be set based on what is to be measured, and the type of signal at the input to the victim line.

The inverted Q output and D input of flip-flop 230 are connected together, and the Q output of flip-flop 230 is connected to a second output connection (e.g., captured output) 232 of system 200. Thus, flip-flop 230 can toggle (e.g., to divide by 2) with each input signal received from the output of comparator circuit 226.

For this embodiment, system 200 also includes a second variable drive circuit 203 connected to one end of a resistor 210. The second end of resistor 210 is connected to one end of a resistor 212 and one end of a capacitor 216. The second end of resistor 212 is connected to a programmable load 214. The second end of capacitor 216 is connected to the junction between resistor 204 and resistor 206.

For test purposes in this example, variable drive circuit 203 has been selected to function as a drive circuit for an aggressor line formed by resistors 210 and 212. Also, for this example, similar to the victim line, this aggressor line can be driven by a digital signal (e.g., via variable drive circuit 203), an external analog signal, or a DC voltage level (e.g., through a transmission gate). Thus, this aggressor line can be driven by the same type of switching signal or steady state DC level that drives the victim line. Alternatively, this aggressor line can be allowed to float. Programmable load 214 provides a source for current flow through this aggressor line. Notably, by use of the variable drive circuit 203 and programmable load 214, this aggressor line (e.g., composed of resistors 210, 212) is also passed through the customized crosstalk circuit or path 236. In this example, capacitor 216 couples this aggressor line to the selected victim line.

System 200 also includes a variable drive circuit 207 connected to one end of a resistor 218. The second end of resistor 218 is connected to one end of a resistor 220 and one end of a capacitor 224. The second end of resistor 220 is connected to a programmable load 222. The second end of capacitor 224 is connected to the junction between resistor 204 and resistor 206. For test purposes in this embodiment, resistors 218 and 220 form a second aggressor line. Also, for this example, this aggressor line can be allowed to float or it can be driven by the same signal as the victim line (e.g., via variable drive circuit 207, external analog signal, or DC voltage level). Programmable load 222 provides a source for current flow through this aggressor line. Notably, by use of the variable drive circuit 207 and programmable load 222, this aggressor line (e.g., composed of resistors 218, 220) is also passed through the customized crosstalk circuit or path 236. In this example, capacitor 224 couples this aggressor line to the selected victim line.

System 200 also includes a variable drive circuit 205 connected to one end of a resistor 213. The second end of resistor 213 is connected to one end of a resistor 215 and one end of a capacitor 217. The second end of resistor 215 is connected to a programmable load 223. The second end of capacitor 217 is connected to the junction between resistor 210 and resistor 212. For test purposes in this embodiment, resistors 213 and 215 form a third aggressor line. Also, for this example, this aggressor line can be allowed to float or it can be driven by the same signal as the victim line (e.g., via variable drive circuit 205, external analog signal, or DC voltage level). Programmable load 223 provides a source for current flow through this aggressor line. Notably, by use of the variable drive circuit 205 and programmable load 223, this aggressor line (e.g., composed of resistors 213, 215) is also passed through the customized crosstalk circuit or path 236. In this example, capacitor 217 couples this aggressor line to the selected victim line (e.g., via capacitor 216).

Additionally, for this illustrative embodiment, system 200 includes a variable drive circuit 209 connected to one end of a resistor 217. The second end of resistor 217 is connected to one end of a resistor 219 and one end of a capacitor 221. The second end of resistor 219 is connected to a programmable load 225. The second end of capacitor 221 is connected to the junction between resistor 218 and resistor 220. For test purposes in this embodiment, resistors 217 and 219 form a fourth aggressor line. Also, for this example, this aggressor line can be allowed to float or it can be driven by the same signal as the victim line (e.g., via variable drive circuit 209, external analog signal, or DC voltage level). Programmable load 225 provides a source for current flow through this aggressor line. Notably, by use of the variable drive circuit 209 and programmable load 225, this aggressor line (e.g., composed of resistors 217, 219) is also passed through the customized crosstalk circuit or path 236. In this example, capacitor 221 couples this aggressor line to the selected victim line (e.g., via capacitor 224).

At this point, it is important to stress that the example embodiment shown for system 200 in FIG. 2 of a single victim line and four aggressor lines is provided for illustrative purposes only, and the present invention is not intended to be so limited. For example, if multiple victim lines are arranged in the same path block, one or more of these victim lines can be switched to function as aggressor lines for other selected victim lines. As such, the aggressor lines can be driven in any of a number of arrangements, and with any one aggressor line to all of the aggressor lines switching, for example, to try to cause a given level of upset due to line crosstalk with the selected victim line. Also, system 200 can include any suitable number of resistive, capacitive and/or inductive circuit components that form a signal crosstalk combination for one or more victim lines and one or more aggressor lines (e.g., represented as an array of 30 metal lines arranged as 6 lines deep by 5 lines wide). For example, the embodiment illustrated by system 200 can be represented with an m by n array, with m=1 and n=2 for the arrangement shown. A plurality of example metal wire structures that can be used for victim and aggressor lines in system 200 are illustrated in FIGS. 3A–3G.

FIGS. 3A–3G are related pictorial representations that depict a plurality of example circuit structures that can be used for signal integrity testing of electronic circuits or electronic circuit devices, in accordance with one or more embodiments of the present invention. For example, the circuit structures depicted in FIGS. 3A–3G can represent metal lines arranged in parallel and/or orthogonally in electronic circuit devices such as, for example, packaged electronic circuit devices, ASICs, LSICs or VLSICs. As such, these example structures represent predefined wiring circuits that can be used to test for signal crosstalk and coupling noise in electronic circuit devices through parallel, orthogonal and fill metal coupling.

Figure 3A:
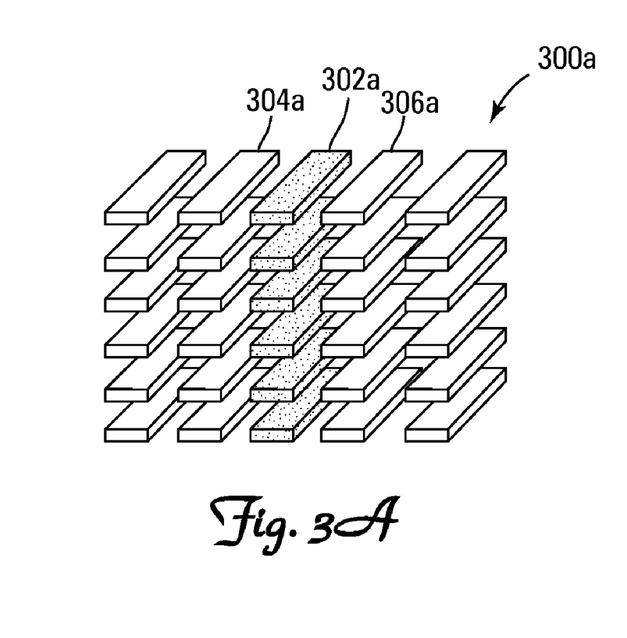
FIGS. 3A–3G are related pictorial representations that depict a plurality of example circuit structures that can be used for signal integrity testing of electronic circuits or electronic circuit devices, in accordance with one or more embodiments of the present invention.

Specifically, FIG. 3A depicts an example signal integrity test circuit structure 300a for signal crosstalk and noise coupling testing, which includes a parallel arrangement of five metal lines (horizontally) stacked in parallel six layers high (vertically). This example circuit can represent a predetermined arrangement of metal wires or lines within different layers in an electronic circuit device (e.g., VSLIC). For example, with respect to system 200 in FIG. 2, the lighter shaded lines (e.g., line 302a) in FIG. 3A can represent selectable victim or aggressor lines, and the darker shaded lines (e.g., lines 304a, 306a) can represent aggressor only lines.

Figure 3B:
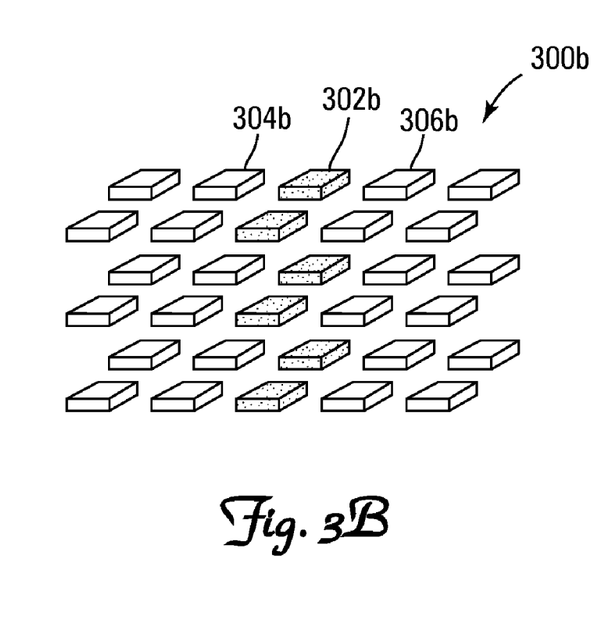

FIG. 3B depicts a second example signal integrity test circuit structure 300b for signal crosstalk and noise coupling testing, which includes a parallel arrangement of five metal lines (horizontally) staggered six layers high (vertically). For example, with respect to system 200 in FIG. 2, the lighter shaded lines (e.g., line 302b) in FIG. 3B can represent selectable victim or aggressor lines, and the darker shaded lines (e.g., lines 304b and 306b) can represent aggressor only lines.

Figure 3C:
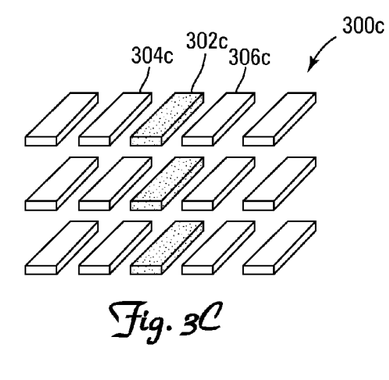

FIG. 3C depicts a third example signal integrity test circuit structure 300c for signal crosstalk and noise coupling testing, which includes a parallel arrangement of five metal lines (horizontally) on three alternating layers (vertically) with a predetermined fill metal inserted between layers. For example, with respect to system 200 in FIG. 2, the lighter shaded lines (e.g., line 302c) in FIG. 3C can represent selectable victim or aggressor lines, and the darker shaded lines (e.g., lines 304c and 306c) can represent aggressor only lines.

Figure 3D:
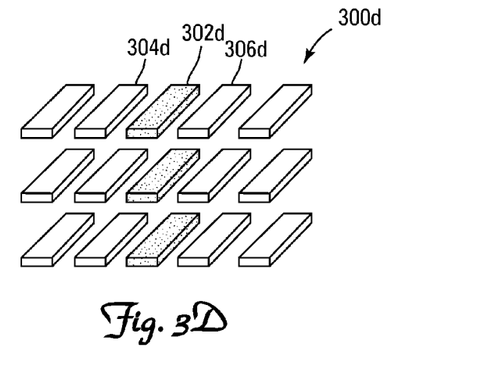

FIG. 3D depicts a fourth example signal integrity test circuit structure 300d for signal crosstalk and noise coupling testing, which includes a second parallel arrangement of five metal lines (horizontally) on three alternating layers (vertically) with a predetermined fill metal between layers. For example, the three layers shown in FIG. 3D can be interleaved with the three layers shown in FIG. 3C to define six layers for one test circuit. In any event, with respect to system 200 in FIG. 2, the lighter shaded lines (e.g., line 302d) in FIG. 3D can represent selectable victim or aggressor lines, and the darker shaded lines (e.g., lines 304d and 306d) can represent aggressor only lines.

Figure 3E:
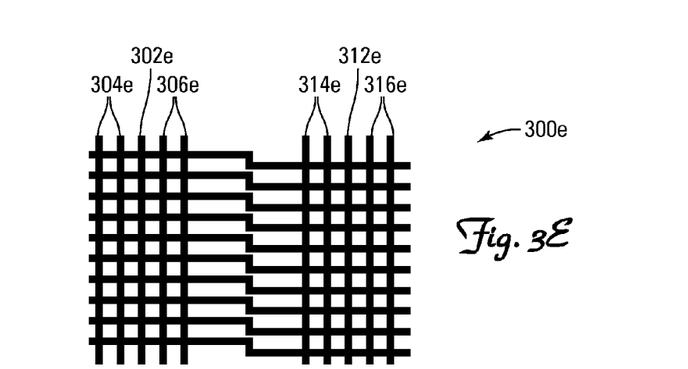

FIG. 3E depicts a fifth example signal integrity test circuit structure 300e for signal crosstalk and noise coupling testing, which includes two groupings of parallel arrangements of five metal lines (horizontally) on alternating layers (vertically) with floating wire lines between layers. For example, with respect to system 200 in FIG. 2, lines 302e, 312e in FIG. 3E can represent selectable victim or aggressor lines, and lines 304e, 314e and 306e, 316e (and all of the horizontally arranged lines) can represent aggressor only lines.

Figure 3F:
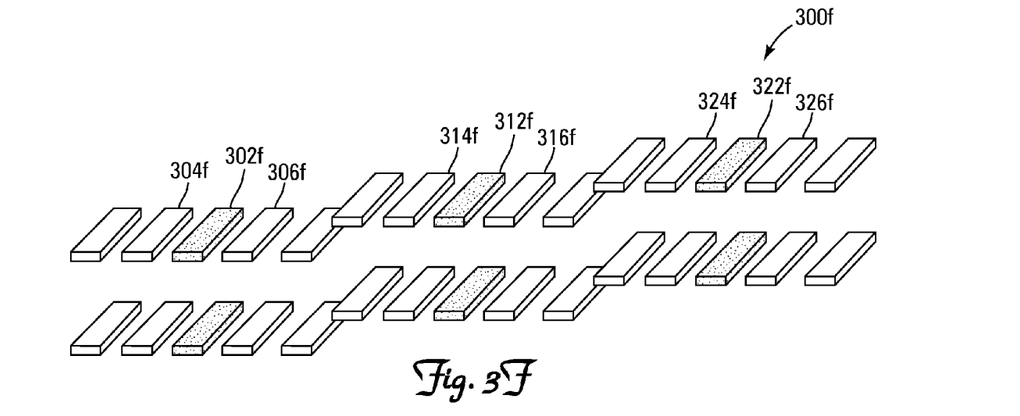

FIG. 3F depicts a sixth example signal integrity test circuit structure 300f for signal crosstalk and noise coupling testing, which includes three groupings of parallel arrangements of five metal lines (horizontally) on three alternating layers (vertically). For example, with respect to system 200 in FIG. 2, the lighter shaded lines (e.g., lines 302f, 312f, 322f in FIG. 3F can represent selectable victim or aggressor lines, and the darker shaded lines (e.g., lines 304f, 306f, 314f, 316f, 324f, 326f) can represent aggressor only lines.

Figure 3G:
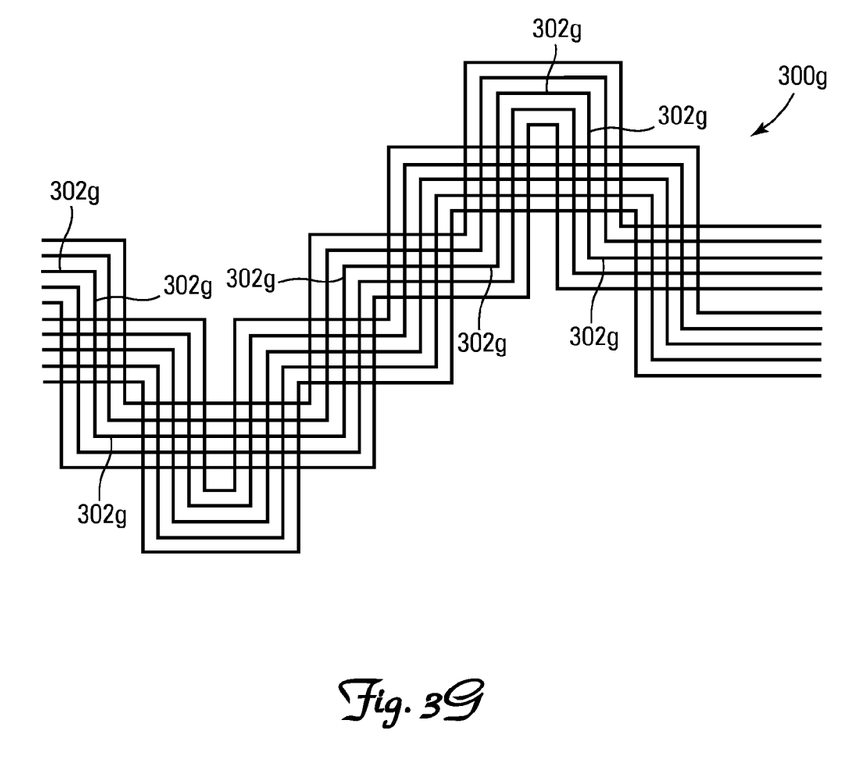

FIG. 3G depicts a seventh example signal integrity test circuit structure 300g for signal crosstalk and noise coupling testing, which includes parallel, stair-stepping arrangements of two groupings of five metal lines overlapping in alternating directions. For example, with respect to system 200 in FIG. 2, the lines denoted as 302g in FIG. 3G can represent victim lines, and the other lines in FIG. 3G can represent aggressor lines.

Returning now to an operation of system 200 in FIG. 2, for this example embodiment, a signal (e.g., from variable drive circuit 202) is applied to the victim line (e.g., resistors 204, 206) and a predetermined load (e.g., programmable load 208). For example, the drive signal can be a switching signal (digital or analog signal), or steady state DC level. The drive signal can be set at a predetermined strength (e.g., high level, low level, or any level in between) to determine, for example, high levels of coupling noise or low levels of coupling noise. The programmable load 208 can be adjusted to dampen the drive signal applied, if desired. A DC offset drive signal can be applied to the victim line in system 200 for determining an exact level of upset or crosstalk between the victim line and one or more aggressor lines. Alternatively, a switching signal (e.g., digital signal or analog AC signal) can be applied to the victim line in system 200 to measure timing push-out or edge degradation for a signal in the victim line, as a result of the coupling noise from the one or more aggressor lines involved.

For this example embodiment, four aggressor lines have been selected and associated with the selected victim line. Each aggressor line can be driven by its respective variable drive circuit (e.g., 203, 205, 207, 209). Thus, each aggressor line involved can be driven by a signal or level similar to the signal or level that is driving the victim line. Each programmable load connected to an aggressor line (e.g., 214, 222, 223, 225) can be adjusted to a desired level and used, if desired, to dampen the drive signal in the respective line. As shown in FIG. 2, the resulting signal in the victim line (e.g., at the junction between resistor 206 and programmable load 208) is applied to an input of comparator circuit 226. This signal applied at the input of comparator 226 is the resultant signal in the victim line, which is influenced by the signal crosstalk between the victim line and the one or more proximal aggressor lines involved (e.g., up to four aggressor lines in this example). Thus, in accordance with the present invention, data on the level(s) of signal crosstalk through or between the victim and aggressor lines can be provided.

Also, for this example, a predetermined reference signal from programmable reference 228 (e.g., data based on a simulation model of a known victim and aggressor line structure) is applied to the second input of comparator circuit 226. This reference signal can represent, for example, a standard, predefined level of signal crosstalk for the particular victim and aggressor line structures involved. Consequently, the output of comparator circuit 226 provides a signal level representing a difference (e.g., positive or negative error) between the measured and predefined signal crosstalk signal information applied to the respective inputs of comparator circuit 226. The difference signal from comparator circuit 226 is output directly by system 200 (e.g., raw output 234), and also applied to the clock input of flip-flop 230. In response to a difference signal (e.g., positive or negative fault or error) received from comparator circuit 226, flip-flop 230 toggles, and provides that result as an output (e.g., captured output) from system 200. Thus, in accordance with the present invention, system 200 uses the data on the level(s) of crosstalk between the victim and aggressor lines, compares that data to predetermined reference data (e.g., based on a known victim/aggressor line structure), and uses the result of that comparison to identify levels of coupling noise in the victim and aggressor lines involved.

It is important to note that while the present invention has been described in the context of a fully functioning signal integrity test system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular signal integrity test system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for identifying one or more effects of coupling noise in an electronic circuit, comprising:
   a victim line, said victim line arranged in the electronic circuit;
   at least one aggressor line, said at least one aggressor line arranged in the electronic circuit and coupled to said victim line;
   means for generating a variable first drive signal, coupled to an input of the victim line;
   means for generating a variable second drive signal, coupled to an input of the at least one aggressor line;
   means for adjusting a dampening level of the variable first drive signal, coupled to an output of the victim line;
   means for adjusting a dampening level of the variable second drive signal, coupled to an output of the at least one aggressor line;
   means for generating a predetermined crosstalk reference signal;
   means for comparing the predetermined crosstalk reference signal with a crosstalk signal present at the output of the victim line, and generating a signal associated with a level of comparison between the predetermined crosstalk reference signal and the crosstalk signal; and wherein the means for adjusting the dampening level of the variable first drive signal and the means for adjusting the dampening level of the variable second drive signal comprise a plurality of programmable loads.

2. The system of claim 1, wherein the means for generating a variable first drive signal comprises a victim drive circuit.

3. The system of claim 1, further comprising:
a switch circuit, said switch circuit coupled to an output of said means for comparing and operable to switch from a first state to a second state responsive to the signal associated with the level of comparison between the predetermined crosstalk reference signal and the crosstalk signal.

4. The system of claim 1, wherein said at least one aggressor line comprises a plurality of aggressor lines coupled to said victim line.

5. The system of claim 1, wherein a signal generated by said means for generating a variable first drive signal comprises a digital signal.

6. The system of claim 1, wherein a signal output by said means for generating a variable first drive signal comprises a steady state DC level.

7. The system of claim 1, wherein a signal output by said means for generating a variable first drive signal comprises a switching signal.

8. The system of claim 1, wherein a signal output from said means for generating a predetermined reference signal comprises a signal crosstalk simulation model signal.

9. The system of claim 1, wherein a signal output from said means for generating a predetermined crosstalk reference signal comprises at least one of a digital signal, AC signal, and steady state DC level.

10. The system of claim 1, wherein at least a portion of said system is arranged externally to the electronic circuit.

11. A system for testing signal integrity, comprising:
a victim line including at least one resistance component having a first predetermined value;
at least one aggressor line including at least one resistance component having a second predetermined value, said at least one aggressor line arranged substantially in parallel to said victim line and coupled to said victim line;
a plurality of variable drive circuits, said plurality of variable drive circuits coupled to said victim line and said at least one aggressor line;
a plurality of programmable loads, each programmable load of said plurality of programmable loads to be used for adjusting a dampening level of the plurality of variable drive circuits coupled to a respective output of said victim line and said at least one aggressor line;
a programmable reference, said programmable reference configured to generate a predetermined crosstalk reference signal; and
a signal comparator, said signal comparator configured to compare the predetermined crosstalk reference signal with a crosstalk signal present at the output of the victim line, and output a signal associated with a level of comparison between the predetermined crosstalk reference signal and the crosstalk signal present at the output of the victim line.

12. The system circuit of claim 11, wherein at least a portion of said circuit is arranged externally to an electronic circuit to be tested.

13. A method for identifying one or more effects of coupling noise in an electronic circuit, comprising the steps of:
selecting a first line arranged in the electronic circuit as a victim line;
generating a variable first drive signal;
coupling the variable first drive signal to an input of the first line;
selecting at least a second line arranged in the electronic circuit as an aggressor line, said at least a second line coupled to said first line;
generating a variable second drive signal;
coupling the variable second drive signal to an input of the at least a second line;
adjusting a dampening level of the variable first drive signal in the first line;
adjusting a dampening level of the variable second drive signal in the at least a second line;
coupling a first input of a signal comparator to an output of said first line;
coupling a predetermined crosstalk reference signal to a second input of said signal comparator;
said signal comparator outputting a signal associated with a level of difference between the predetermined crosstalk reference signal and a crosstalk signal present at the output of said first line wherein the adjusting steps are performed by a plurality of programmable loads.

14. The method of claim 13, wherein the steps of:
adjusting a dampening level of the variable first drive signal in the first line; and
adjusting a dampening level of the variable second drive signal in the at least a second line, comprise the steps of:
setting a first predetermined value of loading in the first line; and
setting a second predetermined value of loading in the at least a second line.

15. The method of claim 13, further comprising the steps of:
coupling a switch circuit to an output of said signal comparator; and
said switch circuit switching from a first state to a second state responsive to said level of difference between the predetermined crosstalk reference signal and the crosstalk signal present at the output of said first line.

16. The method of claim 13, wherein said at least a second line comprises a plurality of aggressor lines.

17. The method of claim 13, wherein the variable first drive signal comprises at least one of a switching signal and steady state DC level.

18. The method of claim 13, wherein the predetermined crosstalk reference signal comprises a signal crosstalk simulation model signal.

* * * * *

UNITED STATES PATENT AND TRADEMARK OFFICE
CERTIFICATE OF CORRECTION

| | |
|---|---|
| PATENT NO. | : 7,225,420 B2 |
| APPLICATION NO. | : 11/054806 |
| DATED | : May 29, 2007 |
| INVENTOR(S) | : Cress |

It is certified that error appears in the above-identified patent and that said Letters Patent is hereby corrected as shown below:

Column 9, line 48, please remove the phrase "to be used for adjusting a dampening level of the plurality of variable drive circuits" and reinsert the phrase after the first occurrence of the word "loads" in line 47

Column 10, line 29, please insert --; and-- after the word "line"

Signed and Sealed this

Twenty-seventh Day of November, 2007

JON W. DUDAS
*Director of the United States Patent and Trademark Office*